United States Patent
Husted et al.

(10) Patent No.: US 8,488,506 B2
(45) Date of Patent: Jul. 16, 2013

(54) OSCILLATOR SETTLING TIME ALLOWANCE

(75) Inventors: Paul J. Husted, San Jose, CA (US); Srenik Mehta, Union City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 157 days.

(21) Appl. No.: 13/171,275

(22) Filed: Jun. 28, 2011

(65) Prior Publication Data

US 2013/0003626 A1 Jan. 3, 2013

(51) Int. Cl.
*G08C 17/00* (2006.01)

(52) U.S. Cl.
USPC .......................................... 370/311; 455/574

(58) Field of Classification Search
USPC .................. 370/350, 503, 311, 324; 455/574, 455/127.5, 148, 196.1, 255
See application file for complete search history.

(56) References Cited

U.S. PATENT DOCUMENTS

| | | | |
|---|---|---|---|
| 4,325,036 A | 4/1982 | Kuwabara | |
| 4,537,515 A | 8/1985 | Dinger et al. | |
| 4,577,162 A | 3/1986 | Peterson | |
| 4,675,617 A | 6/1987 | Martin | |
| 6,333,939 B1 * | 12/2001 | Butler et al. | 370/503 |
| 6,970,022 B1 | 11/2005 | Miller | |
| 7,307,485 B1 | 12/2007 | Snyder et al. | |
| 7,389,088 B2 | 6/2008 | Kim | |
| 7,466,776 B2 | 12/2008 | Yuan et al. | |
| 7,508,246 B2 | 3/2009 | Kase et al. | |
| 7,532,869 B2 | 5/2009 | Ehrenreich et al. | |
| 7,542,529 B2 | 6/2009 | Kobayashi et al. | |
| 7,609,781 B2 | 10/2009 | Kerth et al. | |
| 7,634,290 B2 | 12/2009 | Kelton et al. | |
| 7,653,408 B1 | 1/2010 | Kopikare et al. | |
| 7,787,899 B1 | 8/2010 | Talley et al. | |
| 7,800,457 B2 | 9/2010 | Unkrich et al. | |
| 7,859,421 B2 | 12/2010 | Berthold et al. | |
| 7,873,330 B2 | 1/2011 | Tudosoiu et al. | |
| 2002/0086720 A1 | 7/2002 | Kim | |
| 2009/0245230 A1 * | 10/2009 | Sampath et al. | 370/350 |
| 2010/0218587 A1 | 9/2010 | Stewart | |

FOREIGN PATENT DOCUMENTS

WO  WO0133870  5/2001

OTHER PUBLICATIONS

U.S. Appl. No. 12/541,284, filed Aug. 14, 2009 Entitled: "Wireless Device Using a Shared Gain Stage for Simultaneous Reception of Multiple Protocols".

(Continued)

*Primary Examiner* — Brenda H Pham
(74) *Attorney, Agent, or Firm* — Bay Area Technology Law Group

(57) ABSTRACT

Techniques are disclosed relating to oscillator settling time allowance. In one embodiment, an apparatus may include an oscillator and oscillation detection and control circuitry. The oscillation detection and control circuitry may be configured to awaken an oscillator at a predetermined time and detect an edge transition of oscillations. The oscillation detection and control circuitry may further be configured to measure the time from the power-on indication to edge transition detection. In one embodiment, the oscillation detection and control circuitry may be configured to store the measured time and use the measured time instead of the predetermined time for subsequent oscillator awakenings. In some embodiments, the apparatus may further include circuitry configured to compensate for an expected oscillator settling behavior.

17 Claims, 5 Drawing Sheets

OTHER PUBLICATIONS

U.S. Appl. No. 12/323,338, filed Nov. 25, 2008 Entitled: "Wireless Device Using a Shared Gain Stage for Simultaneous Reception of Multiple Protocols".

International Search Report and Written Opinion—PCT/US2011/047247—ISA/EPO—Mar. 6, 2012.

* cited by examiner

OSCILLATOR SETTLING TIME ALLOWANCE

BACKGROUND OF THE INVENTION

1. Field of the Disclosure

The present invention relates generally to wireless communication, and more particularly to oscillator settling in a wireless device.

2. Description of the Related Art

Wireless communications occur through many wireless devices, such as laptops, cell phones, etc. At times, a wireless device may be in a sleep mode to conserve power while not actively transmitting or receiving data. The wireless device may periodically awaken from its sleep mode to receive a beacon from an access point (wireless local area network (WLAN)), or to receive some other periodic packet (e.g., Bluetooth). FIG. 1 shows a typical wake-sleep period of an oscillator of a wireless device. In the example shown, the oscillator turns on a fixed period well before a beacon is sent (e.g., by an access point) so that the beacon may be properly received by the wireless device. Turning an oscillator on well before a beacon is sent is inefficient and uses more power than necessary.

SUMMARY OF THE INVENTION

Various embodiments described herein relate to techniques and structures that facilitate adapting an oscillator settling time allowance. In one embodiment, an apparatus includes an oscillator configured to awaken from a sleep mode at a predetermined time before an expected periodic signal (e.g., beacon, Bluetooth synchronous connection oriented (SCO) transfer, etc.). In one embodiment, the oscillation detection and control circuitry may be configured to receive the sleep clock and provide a power-on indication to the oscillator. The oscillation detection and control circuitry may further be configured to detect an edge transition of oscillations from the oscillator and measure the time from the power-on indication to edge transition detection. Detection may be performed every sleep-wake cycle of the oscillator or may occur at other periods. In one embodiment, the oscillation detection and control circuitry may be configured to store the measured time and use the measured time in place of the predetermined time for subsequent oscillator awakenings. In some embodiments, the apparatus may further include circuitry configured to compensate for an expected oscillator settling behavior.

BRIEF DESCRIPTION OF THE DRAWINGS

A better understanding of the present disclosure can be obtained when the following Detailed Description of the Embodiments is read in conjunction with the following drawings, in which.

Figure 1:
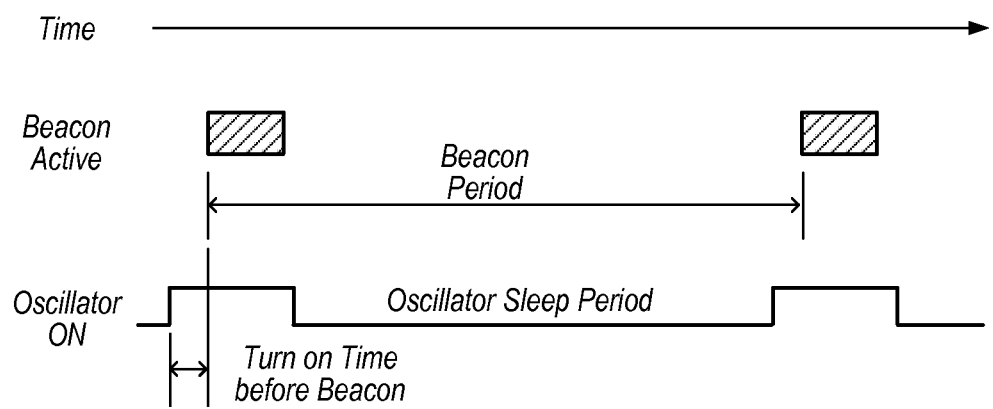
FIG. 1 illustrates a typical wake-sleep cycle of an oscillator of a wireless device.

While the disclosure is susceptible to various modifications and alternative forms, specific embodiments thereof are shown by way of example in the drawings and are herein described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure as defined by the appended claims.

DETAILED DESCRIPTION OF EMBODIMENTS OF THE INVENTION

The following is a glossary of terms used in the present application:

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Storage Medium—a storage medium (or memory medium) may include any non-transitory/tangible storage media readable by a computer/processor. For example, the media may be read to provide instructions and/or data to the computer/processor. For example, a computer readable storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Carrier Medium—a storage medium as described above, as well as a physical transmission medium, such as a bus, network, and/or other physical transmission medium that conveys signals such as electrical, electromagnetic, or digital signals.

Comprising—this term is open-ended. As used in the appended claims, this term does not foreclose additional structure or steps. Consider a claim that recites: "An apparatus comprising an oscillator . . . . " Such a claim does not foreclose the apparatus from including additional components (e.g., a receiver, antenna, etc.).

Configured To—various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

First, Second, etc.—these terms are used as labels for nouns that they precede, and do not imply any type of ordering (e.g., spatial, temporal, logical, etc.). For example, in a wireless device receiving beacons, the terms "first" and "second" expected beacons can be used to refer to any two expected beacons. In other words, the "first" and "second" expected beacons are not limited to logical occurrences 0 and 1.

Based On—this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Figure 2A:
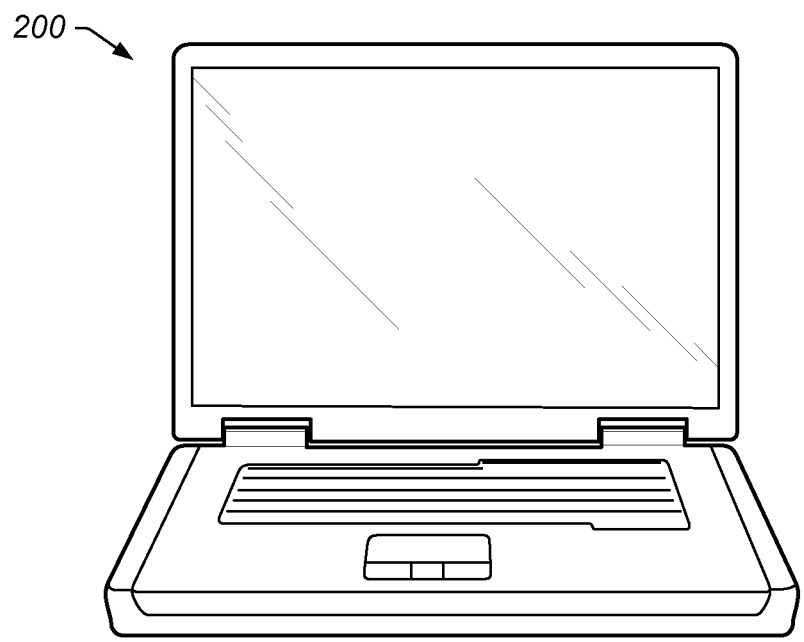
FIGS. 2A and 2B illustrate exemplary wireless devices, according to one embodiment.
Figure 2B:
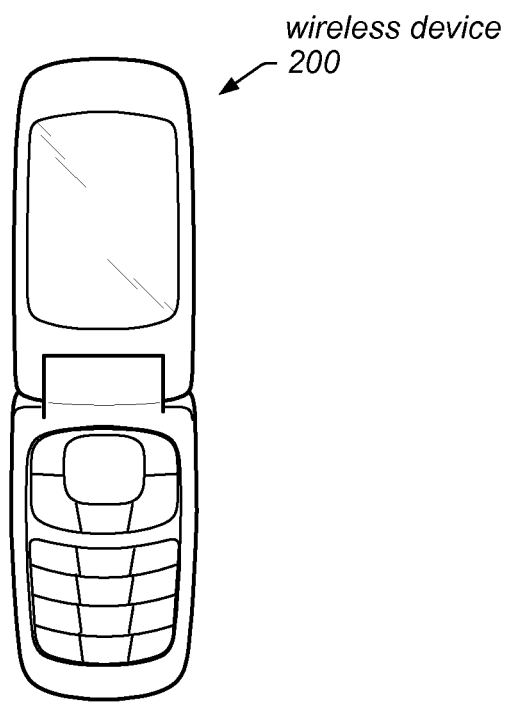

FIGS. 2A and 2B—Exemplary Wireless Devices

FIGS. 2A and 2B illustrate exemplary wireless devices 200, according to one embodiment. As shown in FIG. 2A, wireless device 200 may be a portable computer or other mobile computing device. Alternatively, as shown in FIG. 1B, wireless device 200 may be a cell phone or smart phone or other similar mobile device (which may also be classified as a mobile computing device). However, it should be noted that other wireless devices are envisioned, such as personal digital assistants, multimedia players (portable or stationary), routers, printers, digital cameras, audio players, gaming systems, and/or other mobile devices/computing systems which are operable to use wireless communication. Wireless device 200 may be configured to perform wireless communication (e.g., radio frequency (RF) communication) via a wireless protocol, such as a wireless local area network (WLAN) protocol or Bluetooth.

Wireless device 200 may further be configured to go into a sleep mode. Periodically, wireless device 200 may awaken to receive a beacon or other similar type of packet, depending on the protocol. The beacon may be generated and transmitted by a wireless access point in the case of a Wi-Fi (802.11) device. In one embodiment, the beacon period may be 100 or 102.4 ms. After a beacon is received, wireless device 200 may return to its sleep mode, or may remain awake to perform normal operations.

Figure 3:
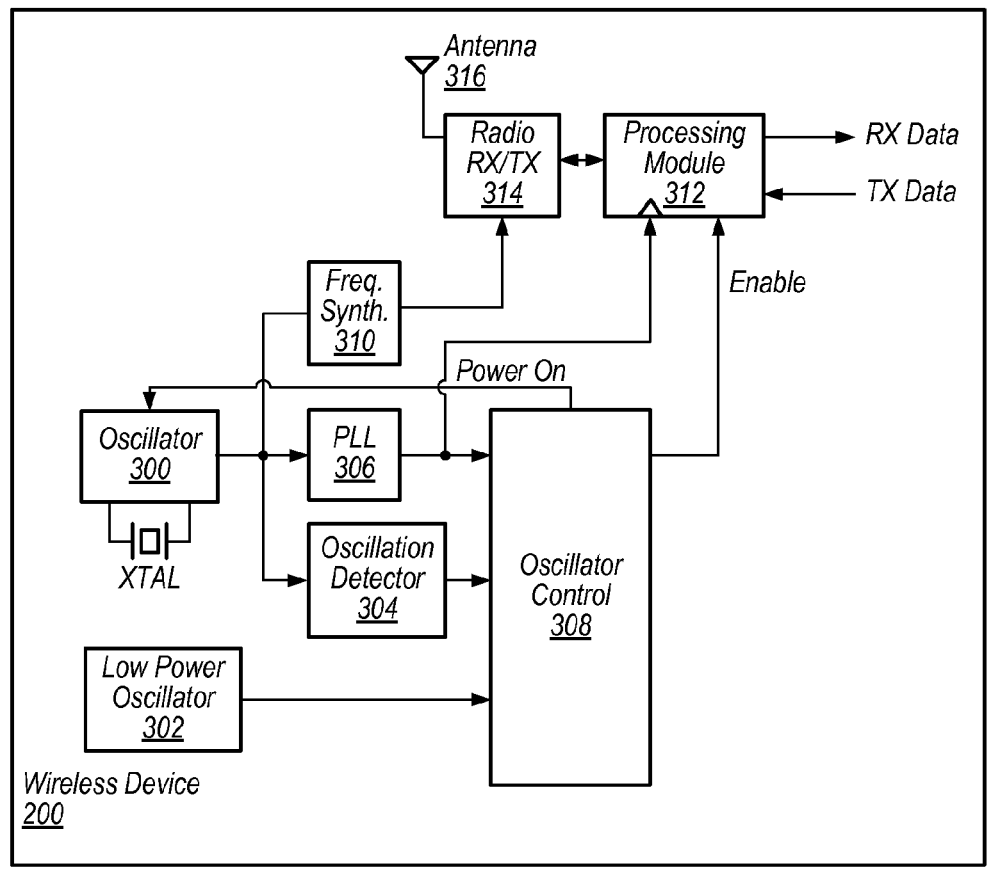
FIG. 3 is an exemplary block diagram of the wireless devices of FIGS. 2A and 2B, according to one embodiment.

FIG. 3—Exemplary Block Diagram of the Wireless Device

As shown in FIG. 3, wireless device 200 may include various components. For example, in the illustrated embodiment, wireless device 200 may include oscillator 300, low power oscillator (LPO) 302, oscillation detector 304, phase-locked loop (PLL) 306, oscillator control 308, frequency synthesizer 310, processing module 312, radio RX/TX 314, and antenna 316. Wireless device 200 may also include other components that are not shown. Note that the various signals and blocks shown in FIG. 2 are a single exemplary embodiment only and variations are envisioned. As one example, oscillation detector 304 and oscillator control 308, as described below, may be combined together into a single component.

In one embodiment, oscillator 300 may include a crystal oscillator (XTAL). Oscillator 300 may output an electric signal that oscillates at a particular frequency. For example, oscillator 300 may include electronic circuitry that may convert energy from a direct-current source into a periodically varying electrical signal or voltage. In other words, oscillator 300 may convert a steady state input signal into a periodic, time variant output signal. The output signal may be a sinusoidal wave, a square wave, a triangular wave, or a number of other repeatable signals. Oscillator 300 may oscillate at a different frequency at varying temperatures, voltages, etc. The output oscillations may provide a clock throughout wireless device 200. For example, oscillator 300 may provide a clock to oscillation detector 304, PLL 306, and frequency synthesizer 310. Certain components, such as PLL 306, may further operate on the signal received from oscillator 300 to provide additional clocks (e.g., clocks having a stepped up or stepped down frequency) throughout wireless device. When wireless device 200 is in a sleep mode, oscillator 300 may cease oscillating. Oscillator 300 may receive a power-on (and/or power-off) indication from oscillator control 308 to indicate when oscillator 300 should awaken or sleep. The power-on signal may be a discrete turn-on indication indicating that oscillator 300 may awaken and stay awake until receiving a power-off signal. Or, in some embodiments, it may be a continuous current indicating that oscillator 300 may awaken and remain awake until the continuous current ceases.

Wireless device 200 may include LPO 302 that may provide a clock to oscillator control 308. In various embodiments, LPO 302 may be included in the chip or may be an external sleep clock. The external sleep clock may be approximately 32 kHz in some embodiments. In one embodiment, the clock may be maintained when wireless device 200 is awake and asleep. During sleep mode, LPO 302 may provide a clock that is of a different frequency than the clock that LPO 302 may provide during awake/normal operations. Further, LPO 302 may oscillate at a different frequency than oscillator 300. As with oscillator 300, LPO 302 may oscillate at different frequencies at different temperature and voltage combinations. LPO 302 may provide power savings to wireless device 200 during sleep mode over oscillator 300. Accordingly, LPO 302 may operate during sleep mode while oscillator 300 may not. The output oscillations of LPO 302 may be described in terms of LPO cycles.

In one embodiment, oscillation detector 304 may receive a signal, such as an oscillation or clock, from oscillator 300, and may provide an indication of detected oscillations to oscillator control 308. Oscillation detector 304 may be configured to detect the received oscillations from oscillator 300. In one embodiment, oscillation detector 304 may detect one or more edge transitions from oscillator 300. Upon oscillation detector 304 detecting received oscillations (e.g., by detecting an edge transition), oscillation detector 304 may provide an indication to oscillator control 308 that oscillator 300 is actively oscillating. Actively oscillating may include oscillations that are not within a tolerance range (e.g., +/−20 parts per million (ppm), +/−500 ppm, etc.). Thus, oscillation detector 304 may, in some embodiments, provide an indication at the first detection of an oscillation. Further, oscillation detector 304 may continue to provide indications as long as edge transitions are detected. For example, oscillation detector 304 may provide a continuous indication to oscillator control 308 that oscillator 300 is oscillating. Alternatively, oscillation detector 304 may provide periodic indications that oscillator 300 is oscillating. In some embodiments, oscillation detector 304 may not provide subsequent indications after the first indication of an edge transition or oscillation. Oscillation detection may occur at the start of each wake cycle, or may occur periodically (e.g., once every N sleep-wake cycles, or based on voltage (when voltage varies by a certain amount), frequency, temperature (when temperature varies by a certain amount), humidity, etc.).

PLL 306 may receive a clock from oscillator 300 and generate one or more clocks. For example, in the illustrated embodiment, PLL 306 may provide one or more clocks to oscillator control 308 and processing module 312. PLL 306 may include clock frequency multiplication and division capabilities such that PLL 306 may generate clocks or varying frequencies. Further, PLL 306 may generate one or more output clocks that may be in phase with the frequency of the input clock received from oscillator 300. The clock provided to processing module 312 may help facilitate a digital compensation technique, as described herein.

In one embodiment, oscillator control 308 may be coupled to oscillator 300, LPO 302, oscillation detector 304, PLL 306, and processing module 312. Oscillator control 308 may receive a clock from LPO 302 and based on the received clock, oscillator control 308 may provide a power-on indication to oscillator 300. As described above, LPO 302 may maintain a clock during the sleep mode of wireless device 200. Oscillator control 308 may transmit the power-on indication after a number of LPO 302 cycles. For example, oscillator control 308 may transmit the power-on indication a certain number of LPO cycles after the previous beacon time, or other period signal, to coincide with a subsequent expected beacon time. The power-on indication provided by oscillator control 308 may be a discrete pulse, a series of discrete pulses (e.g., periodic pulses), or may be a continuous current. Likewise, oscillator control 308 may provide a power off indication to oscillator 300. For example, when wireless device 200 is to go into a sleep mode, oscillator control 308 may provide the power off indication. Oscillator control 308 may further receive one or more clocks from PLL 306. For example, oscillator control 308 may operate off a clock from PLL 306 when wireless device 200 is awake and LPO 302 when wireless device 200 is asleep. In some embodiments, oscillator control 308 may operate from a clock from LPO 302 when wireless device 200 is asleep and some circuitry of oscillator control 308 may operate from one or more clocks from each LPO 302 and PLL 306 when wireless device 200 is awake.

Oscillator control 308 may further store an expected beacon time or another time that may affect oscillator wake-up time (e.g., expected Bluetooth SCO transfers). In one embodiment, oscillator control 308 may track an expected beacon time and subsequent expected beacon times based on a clock from LPO 302. In one embodiment, expected beacon times may be once every 102.4 ms. Accordingly, oscillator control 308 may provide oscillator 300 with an indication to power on at a predetermined time before the expected beacon time. In one embodiment, the predetermined time may be a worst case assumption settling time for a crystal oscillator at a worst case temperature, worst case humidity, etc. As such, the initial predetermined time may be an upper bound. In some embodiments, oscillator control 308 may include circuitry to measure the time from oscillator awakening to edge transition detection. The measured time may be based at least in part on a number of LPO 302 cycles. The measured time may also account for any line delays from oscillator control 308 to oscillator 300 and any other line delays in wireless device 200. The predetermined time may be updated to reflect the measured time. For example, consider a wireless device 200 in which the predetermined time may be 2 ms. The measured time from oscillator 300 turn on to edge transition detection may be 1.3 ms. The new or updated predetermined time for a subsequent awakening may be 1.3 ms. Or, in some embodiments, a slight buffer or pad may be included. Extending the previous example, the new or updated predetermined time may be 1.3 ms plus a 0.1 ms buffer totaling 1.4 ms. For a subsequent sleep-wake cycle, oscillator control 308 may provide the power-on indication to oscillator 300 1.4 ms before the subsequent expected beacon time. In one embodiment, the measured time may be stored separately from the initial predetermined time and the measured time may be used by oscillator control 308 for subsequent awakenings. Oscillation control 308 may measure the time from oscillator 300 awakening to edge transition detection at the start of each wake cycle, or periodically (e.g., based on criteria such as once every N sleep-wake cycles, or based on various voltage, frequency, temperature, humidity considerations, etc.).

In one embodiment, oscillator control 308 may provide an enable indication to processing module 312. For instance, oscillator control 308 may provide an indication for oscillator 300 to turn on, wait for oscillator 308 to begin oscillating, wait some number of LPO 302 cycles after oscillations begin, and then provide an enable indication to processing module 312 before oscillator 300 settles. After oscillator 300 settles, oscillator control 308 may turn on radio RX/TX 314 (signal from oscillator control 308 to radio RX/TX not shown). The enable indication may be used to turn on processing module 312 so that it may perform certain operations before oscillator 300 settles. For example, certain digital operations such as configuring wireless device 200 to receive the next beacon, or other period signal, may be performed before oscillator 300 settles.

In one embodiment, wireless device 200 may include frequency synthesizer 310. Frequency synthesizer 310 may receive oscillations from oscillator 300 and generate one or more output frequencies to provide to radio RX/TX 314. Frequency synthesizer 310 may output stepped up and/or stepped down frequencies, which may be within a range of frequencies, when compared with the input frequency of the oscillations received from oscillator 300. Frequency synthesizer 310 may produce its output(s) using a variety of techniques.

Wireless device 200 may include processing module 312. Processing module 312 may include one or more clocks from PLL 306 and an enable indication from oscillator control 308. Processing module 312 may interface with radio RX/TX 314 and may transmit and receive various data (RX data and TX data) to/from other components (not shown) of wireless device 200. Processing module 312 may include one or more analog to digital (A/D) and digital to analog (D/A) converters. In one embodiment, RX data and TX data may include digital operations for wireless device 200. In one embodiment, processing module 312 may receive an enable indication from oscillator control 308. The enable indication may provide notification to processing module 312 that certain digital operations or other operations may take place. The enable indication may be provided before oscillator 300 settles or converges to a predetermined tolerance, such as +/−20 ppm. For example, a small period of time after oscillator 300 starts oscillating, some operations of wireless device 200 may be performed accurately and glitch free within some other tolerance (e.g. 500 ppm). Digital operations such as reading or writing a set of memory locations or registers, restoring wireless device 200 (e.g., save and restore logic) may be performed before oscillator 300 settles. In one embodiment, such operations may be run off PLL 306, which, in turn, is run off oscillator 300 even though oscillator 300 may not yet be tuned.

In one embodiment, processing module 312 may utilize a digital compensation technique that may enable certain components of wireless device 200 to operate before oscillator 300 settles. The digital compensation technique may compensate for expected oscillator 300 behavior and therefore allow the receiver of radio RX/TX to be turned on before oscillator 300 settles. For example, if oscillator 300 settles in a certain manner, such as in the form of a decaying exponential (see FIG. 4), the digital compensation technique may apply the negative phase of the expected error of an oscillation of oscillator to a clock of radio RX/TX 314. Thus, for a decaying exponential, compensation may be in the form of an exponentially-shaped frequency/phase ramp that may compensate for synthesizer drift. Further, the compensation may use an interpolation to compensate for baseband clock drift. As a result, the digitally compensated signal received from radio RX/TX 314 may appear and operate as if it is within a predetermined tolerance (e.g., +/−20 ppm) and make it more likely that the signal will be received. A similar digital compensation technique may be applied, in some embodiments, to the transmitter portion of radio RX/TX 314 to make the signal waveform compliant with any requirements from the transmitter's specification.

In one embodiment, wireless device 200 may include radio RX/TX 314, which may be coupled to antenna 316. Radio RX/TX 314 may include one or more separate radio frequency (RF) transmitters and receivers, or in some embodiments, one or more combined transmitter/receivers. Radio RX/TX 314 may receive one or more clocks from frequency synthesizer 310, such as a clock to enable radio RX/TX 314 to receive one or more packets, beacons, or other signals. In some embodiments, radio RX/TX 314 may interface with processing module 312. The digital compensation, described herein, may be applied to a clock from frequency synthesizer 310. Signals from frequency synthesizer 310, processing module 312, and/or oscillator control 308 may include an indication to turn on or off radio RX/TX 314. Processing module 312 may provide data to radio RX/TX 314 for radio RX/TX 314 to transmit over an RF frequency. Radio RX/TX 314 may include an amplifier to increase power of the transmission and/or may include an amplifier to amplify received signals. Radio RX/TX 314 may be further configured to demodulate received signals. In one embodiment, the receiving portion of radio RX/TX 314 may be tolerant to errors above a predetermined tolerance. For instance, operations that use low order modulation, such as beacons or other similar signals, may be more error tolerant. Accordingly, for an example tolerance of +/−20 ppm, radio RX/TX 314 may be operable at a higher error threshold and may be turned on and operable before oscillator 300 settles. Radio RX/TX 314, coupled with antenna 316, may operate over a variety of RF spectrums (e.g., 2.4 GHz band). For example, Radio RX/TX 314 may modulate data for transmission via antenna 316. Radio RX/TX 314 may also receive data through antenna 316. Antenna 316 may a directional or omnidirectional antenna.

One or more components of wireless device 200 may, in some embodiments, be implemented by a computer-readable storage medium, memory, or some other component. A computer-readable storage medium may be one embodiment of an article of manufacture that stores instructions that are executable by a processor. As an example, a computer-readable storage medium can be used to store instructions read by a program and used, directly or indirectly, to fabricate hardware for oscillator control 308, described above. For example, the instructions may outline one or more data structures describing a behavioral-level or register-transfer level (RTL) description of the hardware functionality in a high level design language (HDL) such as Verilog or VHDL. The description may be read by a synthesis tool, which may synthesize the description to produce a netlist. The netlist may include a set of gates (e.g., defined in a synthesis library), which represent the functionality of oscillator control 308. The netlist may then be placed and routed to produce a data set describing geometric shapes to be applied to masks. The masks may then be used in various semiconductor fabrication steps to produce a semiconductor circuit or circuits corresponding to oscillator control 308.

By detecting edge transitions of an oscillator, subsequent oscillator and device awakenings may be delayed to more accurately reflect oscillator turn-on behavior. As a result, the oscillator may turn on closer to an expected beacon time, or expected Bluetooth time slot. The delay in turn-on may allow for a shorter on period for the oscillator resulting in power savings. Further, other components of a wireless device may not require the oscillator to be settled to a tolerance level before being turned on and operational. By knowing settling characteristics of the oscillator, the other components may perform operations at a more efficient time as well. Moreover, in a wireless device that utilizes the disclosed digital compensation, a receiver (radio RX/TX) may be more likely to receive a signal and a transmitter (also radio RX/TX) may be more likely to transmit a signal waveform compliant with requirements from a specification.

Figure 4:
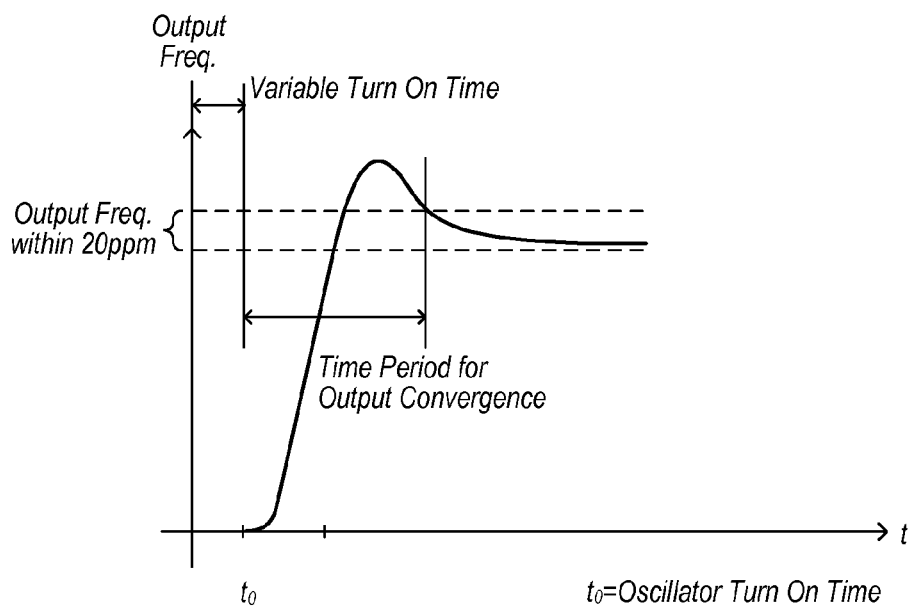
FIG. 4 illustrates output characteristics of an oscillator of FIG. 3, according to some embodiments.

FIG. 4—Oscillator Output Characteristics

FIG. 4 illustrates output characteristics of an oscillator of FIG. 3, according to some embodiments. For the example oscillator in FIG. 4, the output frequency of the oscillator is seen converging to a frequency tolerance range of +/−20 ppm. The tolerance range is illustrated by the dashed lines. At a time $t_0$, the oscillator may turn on. After a variable turn on time period, the oscillator may begin oscillating. The variable turn on time may correspond to the measured time, according to various embodiments. As such, the variable turn on time may vary based on conditions including voltage, temperature, frequency, humidity, etc. FIG. 4 also illustrates a time period for oscillator output convergence. The period for output convergence is less variable than the turn on period. Thus, once the oscillator begins to oscillate, it may be a determinate fixed amount of time to converge to its tolerance (e.g., +/−20 ppm). As described herein, some operations of a wireless device may occur before the oscillator settles to its oscillating frequency. For example, according to some embodiments, some digital operations, transmitting, and receiving may occur before the oscillator settles. Assuming there is no intended traffic for the wireless device, a given wake cycle for an oscillator may be on the order of 3-4 ms for the oscillator to turn on, settle, receive a period signal (e.g., beacon, master clock, etc.), and for the device to be configured to receive the next periodic signal. Not shown in FIG. 4 is entering a subsequent sleep cycle and turning off the oscillator.

Figure 5:
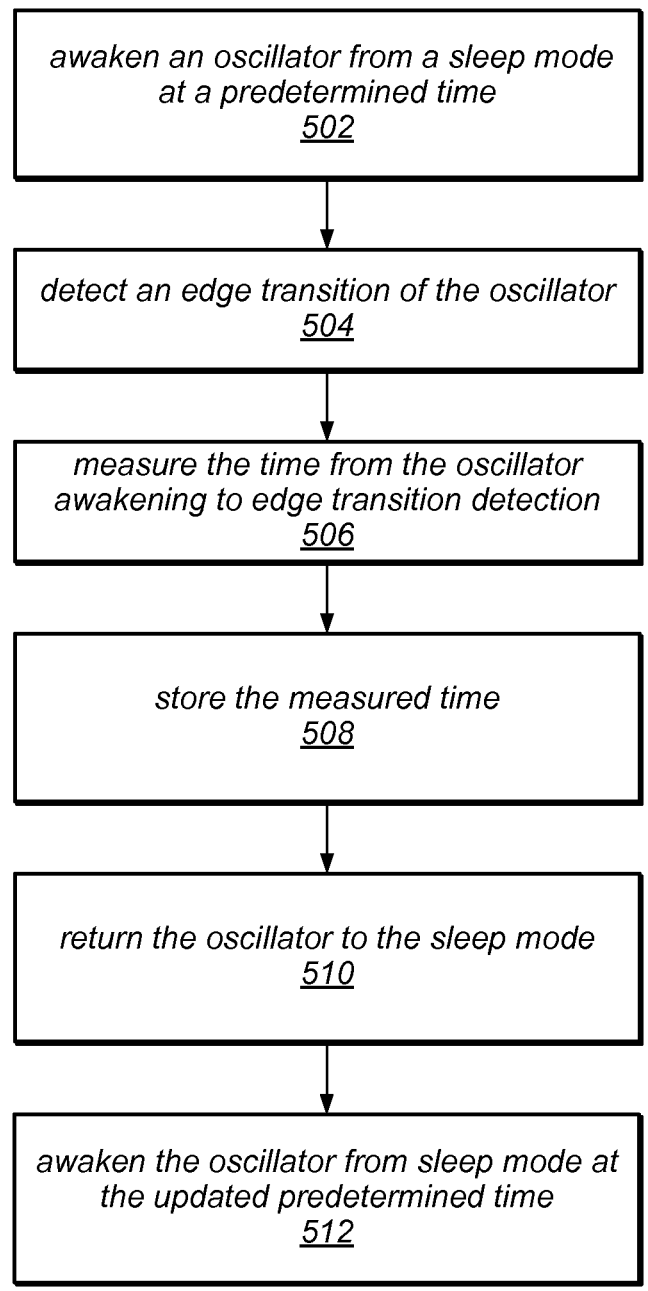
FIG. 5 is a flowchart diagram illustrating one embodiment of a method for adapting a settling time allowance of an oscillator of a wireless device.

FIG. 5—Adapting Oscillator Settling Allowance

FIG. 5 is a flowchart diagram illustrating one embodiment of a method for adapting a settling time allowance of an oscillator of a wireless device. The method shown in FIG. 5 may be used in conjunction with any of the systems or devices shown in the above figures, among other devices. In one embodiment, oscillator control 308 and oscillation detector 304 may perform the method of FIG. 5. In various embodiments, some of the method elements shown may be performed concurrently, in a different order than shown, or may be omitted. In some embodiments, method 500 may include additional (or fewer) steps than shown. For example, method 500 may also employ some or all of the steps of method 600. As shown, method 500 may operate as follows.

At 502, oscillator control 308 may awaken oscillator 300 from sleep mode at a predetermined time. The predetermined time may be a time before an expected periodic signal or other periodic event (e.g., a beacon, a master clock, expected time slot, etc.). In one embodiment, oscillator control 308 may store expected periodic signal times. For example, oscillator control 308 may expect a beacon at times 5 ms, 105 ms, and 205 ms. Or, oscillator control 308 may expect a beacon at a time 5 ms and may store a beacon interval of 100 ms. Oscillator control 308 may utilize software in conjunction with LPO 302 cycles to determine when to awaken oscillator 300. In one embodiment, oscillator control 308 may awaken oscillator 300 at 2 ms before an expected beacon time. In the above example, if oscillator control 308 expects a beacon at 5 ms, oscillator control 308 may awaken oscillator 300 at a time of 3 ms. As described in subsequent blocks, the predetermined time may be adjusted to adjust the amount of time that oscillator 300 is awakened before the expected beacon.

At 504, oscillation detector 304 may detect an edge transition of oscillator 300. In one embodiment, oscillation detector 304 may be an independent component of wireless device 200 while in some embodiments, oscillation detector 304 may be a subcomponent of oscillator control 308. An edge transition may be a transition from an increasing frequency of an output of oscillator 300 to a decreasing frequency (or vice versa). For example, an output of oscillator may ramp from 0 Hz to 3.0 GHz before ramping back down to converge toward 2.4 GHz. The transition near 3.0 GHz from an increasing frequency to a decreasing frequency may be an edge transition. Oscillation detector 304 may provide an indication of oscillation detection to oscillator control 308. In one embodiment, oscillation detection may occur each sleep-wake cycle. In some embodiments, oscillation detection may occur every N sleep-wake cycles or dependent on other conditions (e.g., temperature, voltage, humidity, etc.).

At 506, oscillator control 308 may measure the time from oscillator 300 awakening to edge transition detection. In one embodiment, oscillator control 308 may measure the time to edge transition detection in terms of LPO cycles. The measured time may be a time from when oscillator control 308 provides a power-on indication to oscillator 300 to the time when oscillator control 308 receives indication of oscillation detection from oscillation detector 304. In one embodiment, oscillator control 308 may subtract an offset for various line delays. In one embodiment, oscillator control 308 may not measure the time from oscillator 300 awakening to edge transition detection for each sleep-wake cycle. Instead, it may be measured every N sleep-wake cycles or dependent on other conditions (e.g., temperature, voltage, humidity, etc.).

At 508, oscillator control 308 may store measured time. In one embodiment, oscillator control 308 may replace the predetermined time with the measured time such that subsequent awakenings may use the measured time. Oscillator control 308 may be reset to recover the original predetermined time. In one embodiment, oscillator control 308 may store the measured time in a different location than the predetermined time. Accordingly, subsequent awakenings may occur at either the predetermined time or measured time before an expected periodic signal.

At 510, oscillator control 308 may return oscillator 300 to sleep mode. If wireless device 200 is not currently active, oscillator 300 may return to sleep mode to conserve power. In one embodiment, some digital and/or radio operations may occur before oscillator control 308 returns oscillator 300 to sleep mode. Some of those digital operations may be used to prepare wireless device 200 to receive a subsequent periodic signal.

At 512, oscillator control 308 may awaken oscillator 300 from sleep mode at the updated predetermined time before another expected periodic signal time. In one embodiment, block 512 may occur in a similar fashion to block 502 with the exception of using the measured time instead of the predetermined time. In some embodiments, the measured time may be used to update the predetermined time such that they are one in the same until the next measured time. Blocks 502 to 512 may repeat for subsequent sleep-wake cycles. Wireless device 200 may be active for long periods of time than just the time to awaken, settle, and receive a periodic signal. In those circumstances, oscillator 300 may continue to oscillate until wireless device is no longer active, at which point it may reenter sleep mode.

The above blocks of method 500 may be initiated by a processor, processors, a CPU, a memory, a computer-readable storage medium or any combination thereof.

The method of FIG. 5 may allow wireless device 200 and oscillator 300 to sleep longer before waking up to receive expected periodic signals. As a result, wireless device 200 may be more efficient and save power. Further, by detecting edge transitions, method 500 may result in improved accuracy of an oscillator's settling behavior (i.e., to a finer precision in terms of ppm).

Figure 6:
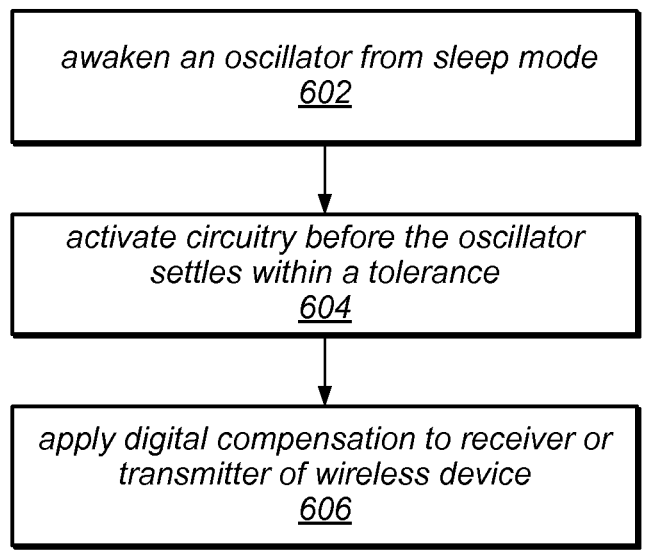
FIG. 6 is a flowchart diagram illustrating one embodiment of a method for applying a compensation technique to offset frequency settling behavior of an oscillator of a wireless device.

FIG. 6—Compensation Technique to Offset Oscillator Frequency Settling Behavior FIG. 6 is a flowchart diagram illustrating one embodiment of a method for applying a compensation technique to offset frequency settling behavior of an oscillator of a wireless device. The method shown in FIG. 6 may be used in conjunction with any of the systems or devices shown in the above figures, among other devices. In one embodiment, oscillator control 308 and processing module 312 may perform the method of FIG. 6. In various embodiments, some of the method elements shown may be performed concurrently, in a different order than shown, or may be omitted. In some embodiments, method 600 may include additional (or fewer) steps than shown. For example, method 600 may also employ some or all of the steps of method 500. Further, method 600 may work in conjunction with method 500 or may occur independently. As shown, method 600 may operate as follows.

At 602, oscillator control 308 may awaken an oscillator from sleep mode before an expected periodic signal time. Block 602 may operate in a similar manner to block 502 of FIG. 5, as described above.

At 604, oscillator control 308 may activate circuitry of wireless device 200 before oscillator 300 settles within a tolerance. For example, a receiver and/or transmitter of radio RX/TX 314 and/or processing module 312 may be activated before oscillator 300 settles. In one embodiment, radio RX/TX 314 may run off a clock from frequency synthesizer 310 and processing module 312 from a clock of PLL 306, both of which may be derived from oscillator 300. The receiver portion of radio RX/TX 314 may perform some operations (e.g., receiving low-order modulation beacons) at a higher tolerance. For example, if the predetermined tolerance is 20 ppm, the receiver may operate, in some circumstances, at 200 ppm, and may be turned on earlier to allow operations to occur before oscillator 300 settles. Radio RX/TX 314 and/or processing module 312 may also be turned on early in conjunction with the digital compensation of block 606.

At 606, processing module 312 may apply digital compensation to a receiver and/or transmitter (radio RX/TX 314) of wireless device 200. In one embodiment, processing module 312 may apply digital compensation before oscillator 300 settles. The digital compensation may compensate for expected oscillator 300 behavior to allow radio RX/TX 314 to be operational before oscillator 300 settles. As an example, oscillator 300 may settle in the form of a decaying exponential. The digital compensation technique may apply the negative phase of the expected error to one or more clocks of radio RX/TX 314. In one embodiment, the digital compensation may be in the form of an exponentially-shaped frequency/phase ramp that may be used to compensate for synthesizer drift. The digital compensation may also include an interpolation to compensate for baseband clock drift. In some embodiments, the digital compensation, or correction, may be applied a fixed amount after $t_0$, which may align with the expected crystal settling behavior after turn on.

The above blocks of method 600 may be initiated by a processor, processors, a CPU, a memory, a computer-readable storage medium or any combination thereof.

Method 600 may make it more likely that a signal is received by radio RX/TX 314 and more likely that a transmitted signal is complaint with a specification of radio RX/TX 314. In addition, when used in conjunction with method 500, method 600 may yield additional efficiency and power savings for wireless device 200.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus, comprising:
   an oscillator configured to awaken from a sleep mode at a predetermined time, wherein the oscillator is further configured to oscillate at an output frequency;
   a clock configured to maintain a sleep clock when the oscillator is asleep; and
   oscillator detection and control circuitry coupled to the clock and the oscillator, wherein the oscillator detection and control circuitry is configured to:
   receive the sleep clock from the clock and provide a power-on indication to the oscillator;
   detect an edge transition of an oscillation of the oscillator;
   measure a time from the power-on indication to edge transition detection; and
   store the measured time;
   wherein the measured time is used to awaken the oscillator at a first time, wherein the first time is different than the predetermined time.

2. The apparatus of claim 1, further comprising a low power oscillator that includes the clock, wherein the measured time is based at least in part on measured low power oscillator cycles.

3. The apparatus of claim 1, further comprising a module configured to perform digital operations after the oscillator begins oscillating but before the oscillator settles to a predetermined tolerance.

4. The apparatus of claim 1, further comprising a receiver configured to receive a signal after the oscillator begins oscillating but before the oscillator settles to a predetermined tolerance.

5. The apparatus of claim 1, wherein the oscillator detection and control circuitry is further configured to skip detecting edge transitions for a sleep-wake cycle of the oscillator based on one or more criteria.

6. The apparatus of claim 1, further comprising a receiver clock configured to receive digital compensation to compensate for a frequency synthesizer drift.

7. A method, comprising:
   awakening an oscillator from a sleep mode at a predetermined time;
   detecting an edge transition of the oscillator;
   measuring the time from the oscillator awakening to edge transition detection; and
   storing the measured time;
   wherein the measured time is used to awaken the oscillator at a first time, wherein the first time is different than the predetermined time.

8. The method of claim 7, further comprising:
   returning the oscillator to the sleep mode; and
   awakening the oscillator from the sleep mode at the first time.

9. The method of claim 7, wherein the measuring occurs after each awakening of the oscillator.

10. The method of claim 7, further comprising activating circuitry before the oscillator has settled within a predetermined tolerance.

11. The method of claim 7, further comprising applying a digital compensation technique to offset a frequency settling behavior of the oscillator.

12. A non-transitory computer readable medium storing program instructions, wherein the program instructions are computer executable to perform:
    awakening an oscillator from a sleep mode at a predetermined time;
    detecting an edge transition of the oscillator;
    measuring the time from the oscillator awakening to edge transition detection; and
    storing the measured time;
    wherein the measured time is used to awaken the oscillator at a first time, wherein the first time is different than the predetermined time.

13. The non-transitory computer readable storage medium of claim 12, wherein the program instructions are further computer executable to perform:
    returning the oscillator to the sleep mode; and
    awakening the oscillator from the sleep mode at the first time.

14. The non-transitory computer readable storage medium of claim 12, wherein the program instructions are further computer executable to perform activating circuitry before the oscillator has settled within a predetermined tolerance.

15. The non-transitory computer readable storage medium of claim 12, wherein the program instructions are further computer executable to perform applying a digital compensation technique to offset a frequency settling behavior of the oscillator.

16. The non-transitory computer readable storage medium of claim 15, wherein the digital compensation technique includes an exponentially-shaped frequency ramp.

17. An apparatus, comprising:
    an oscillator configured to awaken from a sleep mode at a time, wherein the oscillator is further configured to oscillate at an output frequency;
    a clock configured to maintain a sleep clock when the oscillator is asleep;
    oscillator detection and control circuitry coupled to the clock and the oscillator, wherein the oscillator detection and control circuitry is configured to:
    receive the sleep clock from the clock and provide a power-on indication to the oscillator;
    detect an edge transition of an oscillation of the oscillator;
    measure a time from the power-on indication to edge transition detection; and
    store the measured time;
    wherein the measured time is used to awaken the oscillator at an updated time.

* * * * *